(12) United States Patent
Subramanian et al.

(10) Patent No.: US 10,840,919 B1
(45) Date of Patent: Nov. 17, 2020

(54) FREQUENCY DOMAIN-BASED CLOCK RECOVERY

(71) Applicant: TEXAS INSTRUMENTS INCORPORATED, Dallas, TX (US)

(72) Inventors: Shyam Subramanian, Bengaluru (IN); Nagalinga Swamy Basayya Aremallapur, Ranebennur (IN); Jagannathan Venkataraman, Bengaluru (IN); Aravind Ganesan, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/861,413

(22) Filed: Apr. 29, 2020

(30) Foreign Application Priority Data

Jan. 24, 2020 (IN) .............................. 202041003223

(51) Int. Cl.
*H03L 7/089* (2006.01)
*H03L 7/091* (2006.01)
*H03L 7/08* (2006.01)
*H03L 7/087* (2006.01)

(52) U.S. Cl.
CPC ............ *H03L 7/0891* (2013.01); *H03L 7/087* (2013.01); *H03L 7/0807* (2013.01); *H03L 7/091* (2013.01)

(58) Field of Classification Search
CPC ....... H03L 7/0891; H03L 7/087; H03L 7/099; H03L 7/0807; H03L 7/091; H03L 2207/06; H03L 7/0805; H03L 7/0814; H03L 7/113; H03L 7/107; H04L 7/033; H04L 7/0331
See application file for complete search history.

(56) References Cited

U.S. PATENT DOCUMENTS 5,610,954 A * 3/1997 Miyashita ............... H03K 5/133
  375/375
5,818,304 A * 10/1998 Hogeboom ............. H03L 7/113
  331/11

(Continued)

OTHER PUBLICATIONS

Richman, Donald. "Color-Carrier Reference Phase Synchronization Accuracy in NTSC Color Television*" R583. NTSC Technical Monograph No. 7, Proceedings of the I-R-E, Jan. 1954, pp. 106-133.

(Continued)

*Primary Examiner* — Khanh C Tran
(74) *Attorney, Agent, or Firm* — John R. Pessetto; Charles A. Brill; Frank D. Cimino

(57) ABSTRACT

A clock data recovery circuit includes a phase detector (PD) having a data input, a second input, and an output. The circuit also includes a filter, first and second charge pumps, a voltage-controlled oscillator (VCO), and a frequency detector (FD). The first charge pump couples between the output of the PD and the filter. The VCO has first and second inputs and an output. The first input of the VCO couples to the filter, and the VCO output couple to the second input of the PD. The FD has a data input, a second input, and first and second outputs. The FD second output couples to the second input of the VCO. The FD data input couples to the data input of the phase detector, and the FD second input couples to the output of the VCO. The second charge pump couples between the FD first output and the filter.

20 Claims, 4 Drawing Sheets

(56) References Cited

U.S. PATENT DOCUMENTS

| | | | | |
|---|---|---|---|---|
| 7,439,816 | B1* | 10/2008 | Lombaard | H03L 7/07 331/11 |
| 7,728,675 | B1* | 6/2010 | Kennedy | H03L 7/0898 331/16 |
| 2005/0242890 | A1* | 11/2005 | Wu | H03L 7/10 331/18 |
| 2007/0021933 | A1* | 1/2007 | Sanduleanu | H03L 7/107 702/72 |
| 2009/0289673 | A1* | 11/2009 | Chiu | H03K 3/0322 327/157 |
| 2015/0213873 | A1* | 7/2015 | Joo | H03L 7/083 365/154 |
| 2015/0270947 | A1* | 9/2015 | Tiwari | H04L 7/033 375/359 |
| 2016/0211855 | A1* | 7/2016 | Unruh | H04B 1/40 |
| 2017/0163267 | A1* | 6/2017 | Guinea Trigo | H04L 7/033 |

OTHER PUBLICATIONS

Hogge, Charles R. "A Self Correcting Clock Recovery Circuit." Journal of Lightwave Technology, vol. LT-3, No. 6, Dec. 1985, pp. 1312-1314.

Pottbacker, Ansgar et al. "A Si Bipolar Phase and Frequency Detector IC for Clock Extraction up to 8 Gb/s." IEEE Journal of Solid-State Circuits, vol. 27, No. 12, Dec. 1992, pp. 1747-1751.

Bellisio, J.A. "A New Phase-Locked Timing Recovery Method for Digital Regenerators." In 1976 International Conference on Communications, vol. 1, ICC76, Jun. 14-16, 1976, Philadelphia, PA, pp. 10-17—10-20.

Alexander, J.D. H. "Clock Recovery From Random Binary Signals." Electronics Letters Oct. 30, 1975, vol. 11, No. 22, pp. 541-542 (Downloaded from Texas Instruments Virtual Library).

* cited by examiner

FREQUENCY DOMAIN-BASED CLOCK RECOVERY

CROSS-REFERENCE TO RELATED APPLICATIONS

This application claims priority to India Provisional Application No. 202041003223, filed Jan. 24, 2020, which is hereby incorporated by reference.

BACKGROUND

In serial communications, serial data is transmitted from a transmitter to a receiver. In some serial communication techniques, a dock is not transmitted along with the data. Instead, the receiver includes a clock and data recovery (CDR) circuit to extract a clock from the serial data and use the extracted dock to decode the transmitted symbols.

Some CDR implementations require the use of a reference dock. A reference clock for a CDR circuit is generated external to the chip containing the receiver and thus a pin is dedicated for use in receiving the reference dock. In lossy channels, the serial data received by the receiver may suffer from large inter-symbol interference.

SUMMARY

In one example, a clock data recovery circuit includes a phase detector (PD) having a data input, a second input, and an output. The circuit also includes a filter, first and second charge pumps, a voltage-controlled oscillator (VCO), and a frequency detector (FD). The first charge pump couples between the output of the PD and the filter. The VCO has first and second inputs and an output. The first input of the VCO couples to the filter, and the VCO output couple to the second input of the PD. The FD has a data input, a second input, and first and second outputs. The FD second output couples to the second input of the VCO. The FD data input couples to the data input of the phase detector, and the FD second input couples to the output of the VCO. The second charge pump couples between the FD first output and the filter.

BRIEF DESCRIPTION OF THE DRAWINGS

For a detailed description of various examples, reference will now be made to the accompanying drawings in which.

DETAILED DESCRIPTION

As explained above, some CDR implementations require the use of an externally-supplied reference clock. Such reference clocks generally necessitate a dedicate pin on the chip to receive the externally-generated reference clock. The use of a dedicated pin drives up the bill of material (BOM) costs and complicates the design for the printed circuit board on which the receiver requiring the externally-supplied reference clock is to be used. The examples described herein are directed to a CDR circuit that does not require an externally-supplied reference clock. Further, the CDR circuit described herein is data-modulation-technique independent meaning that the CDR circuit can recover a clock from serial data that has been modulated with any of a variety of modulation techniques (e.g., pulse amplitude modulation (PAM), non-return-to-zero (NRZ), etc.).

Figure 1:
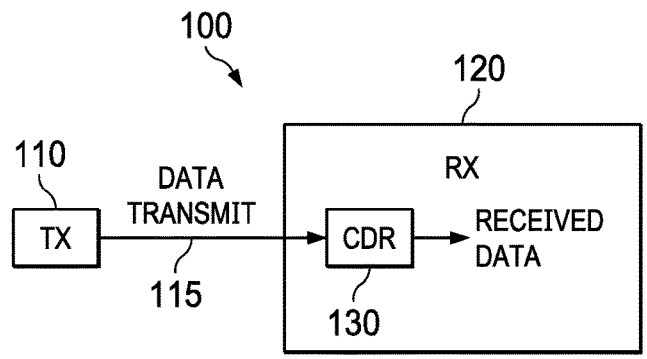
FIG. 1 shows an example serial communication including a receiver with a CDR circuit in accordance with the disclosed examples.

FIG. 1 illustrates a serial communication system 100 that includes a transmitter 110 coupled to a receiver 120 over a communication link 115. The transmitter 110 encodes data into a serial communication stream using a transmit clock and sends the transmit data over the serial communication link 115 to the receiver 120. The transmit data rate is the frequency at which the transmitter 110 transmits serial data to the receiver 120. The receiver 120 includes a CDR circuit 130 which extracts a clock from the serial transmit data received from the transmitter and uses the extracted clock to decode the transmitted symbols to thereby produced the recovered data for use by, for example, other circuits within the semiconductor die (chip) containing the RX 120. While the transmit data is shown as an input to the CDR 130 in the example of FIG. 1, the input of the CDR 130 is not necessarily the transmit data directly from the communication link 115. In some examples, the receiver may have other components between the receiver's input and the CDR such as a continuous-time-equalizer (also called CTLE) or continuous-time-linear-equalizer).

Figure 2:
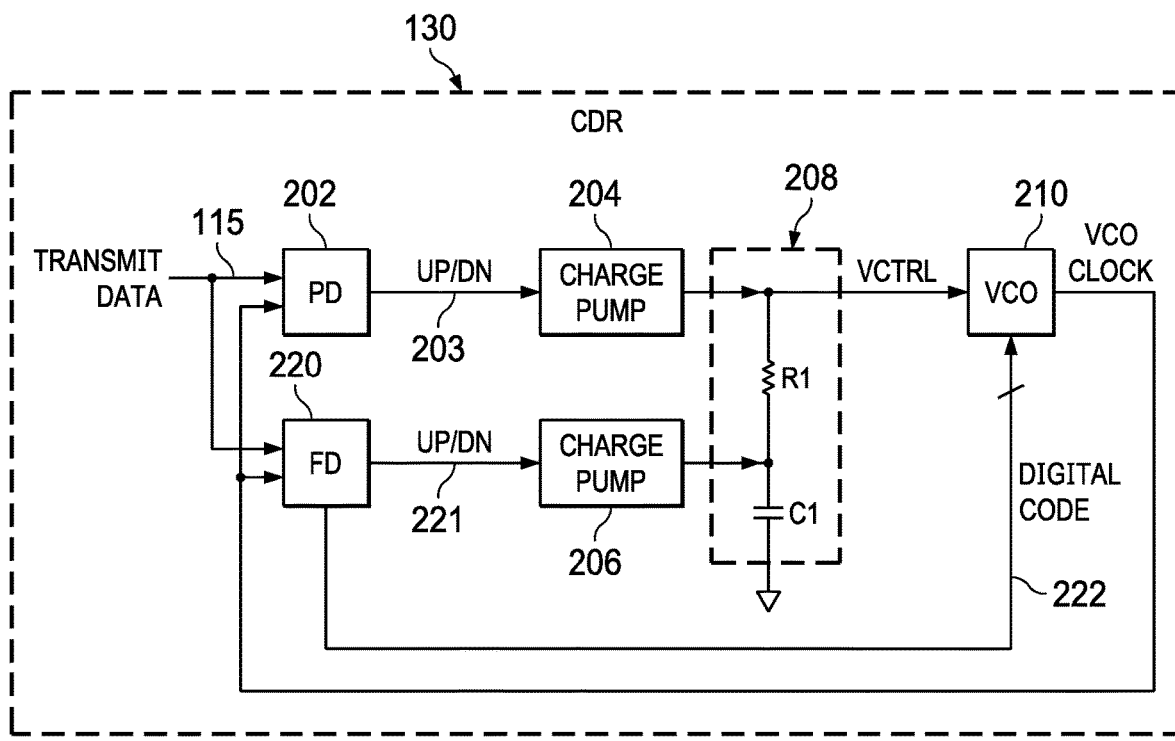
FIG. 2 shows an example implementation of the CDR circuit of FIG. 1.

FIG. 2 shows an example of at least a portion of a CDR circuit 130. In this example, CDR circuit 130 includes a phase detector (PD) 202, charge pumps 204 and 206, a filter 208, a voltage-controlled oscillator 210, and a frequency detector (FD) 220. The transmit data from the transmitter 110 is provided to inputs of both PD 202 and FD 220. The output of VCO 210 provides a VCO CLOCK that is provided to the other inputs of PD 202 and FD 220. The VCO CLOCK frequency may be a submultiple of the "recovered clock frequency," which is the receiver's estimate of the transmit data rate. The PD 202 generates output up and down (UP/DN) signals 203 based on the phase difference between the input transmit data and VCO CLOCK. The output up/down signals 203 from PD 202 are provided to the charge pump 204. Charge pump 204 is coupled to filter 208. Based on the UP/DN signals 203, positive current either flows from the charge pump 204 into the filter 208 (e.g., when UP is active) or from the filter into charge pump (e.g., when DN is active). Filter 208 provides a voltage control (VCTRL) signal to VCO 210. VCTRL controls the frequency of VCO CLOCK produced by VCO 210.

FD 220 generates UP/DN signals 221 to its corresponding charge pump 206 based on the frequency difference between the transmit data rate and the recovered clock frequency. FD 220 also generates DIGITAL CODE 222 to the VCO 210. DIGITAL CODE is generated by FD 220 as explained below and also controls the frequency of the VCO's VCO CLOCK. When CDR 130 is "in lock" (i.e., locked to the transmit data frequency), VCO CLOCK represents the clock extracted from the transmit data and can be used by a data recovery circuit to recover the transmitted tones.

As can be seen in FIG. 2, CDR circuit 130 does not use an externally-provided reference clock. In other CDR implementations, a reference clock maybe used to control the digital code value to the VCO. In the example of FIG. 2, however, FD 220 does not use an externally-provided reference clock to generate DIGITAL CODE to the VCO 210. Instead, FD 220 generates DIGITAL CODE 222 based on the signals comprising the transmit data and the VCO CLOCK.

Figure 3:
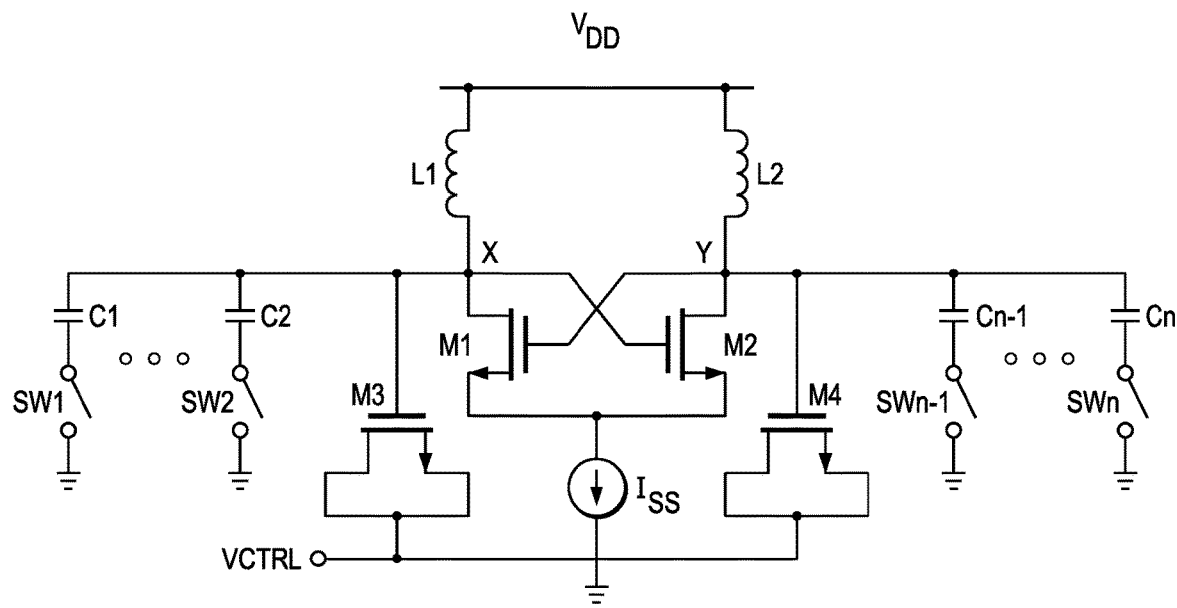
FIG. 3 shows an example of a voltage-controlled oscillator for use in the CDR circuit of FIG. 2.

FIG. 3 shows an example implementation of VCO 210 of FIG. 2. In the example of FIG. 3, VCO 210 is an LC VCO and includes inductors L1 and L2, transistors M1, M2, M3, and M4, capacitors C1, C2, . . . , Cn. For each capacitor C1-Cn, a corresponding switch SW1, SW2, . . . , SWn couples the capacitor to ground. Each capacitor can be selected (coupled to ground) by turning on the respective switch and can be deselected by turning off the respective switch. The DIGITAL CODE generated by FD 220 is used to control the on/off state of the switches SW1-SWn.

Inductor L1 is coupled between VDD and the drain of M1 and the capacitors on the left-side of the schematic at node X. L2 is coupled between VDD and the drain of M2 and the capacitors on the right-side of the schematic at node Y. The gate of M1 is coupled to node Y and the gate of M2 is coupled to node X. A current source Iss is coupled to the sources of M1 and M2 and provides bias current through M1 and M2.

The gate of M3 is coupled to node X. The drain and source of M3 are coupled together and receive the control voltage VCTRL. Similarly, the gate of M4 is coupled to node Y. The drain and source of M4 are coupled together and also receive the control voltage VCTRL. The frequency of oscillation of an LC VCO decreases with increasing capacitance C connected to nodes X and Y. This capacitance C can be split into the capacitance Cx that is controlled by the digital code and another capacitance Cy that is usually a "varactor" controlled by the control voltage VCTRL. The output of the VCO of FIG. 3 is the voltage difference between nodes X and Y. In other implementations, VCO 210 may comprise a ring oscillator. In this case also, the VCO frequency will have a component controlled by the digital code and another component controlled by the analog control voltage VCTRL.

Figure 4:
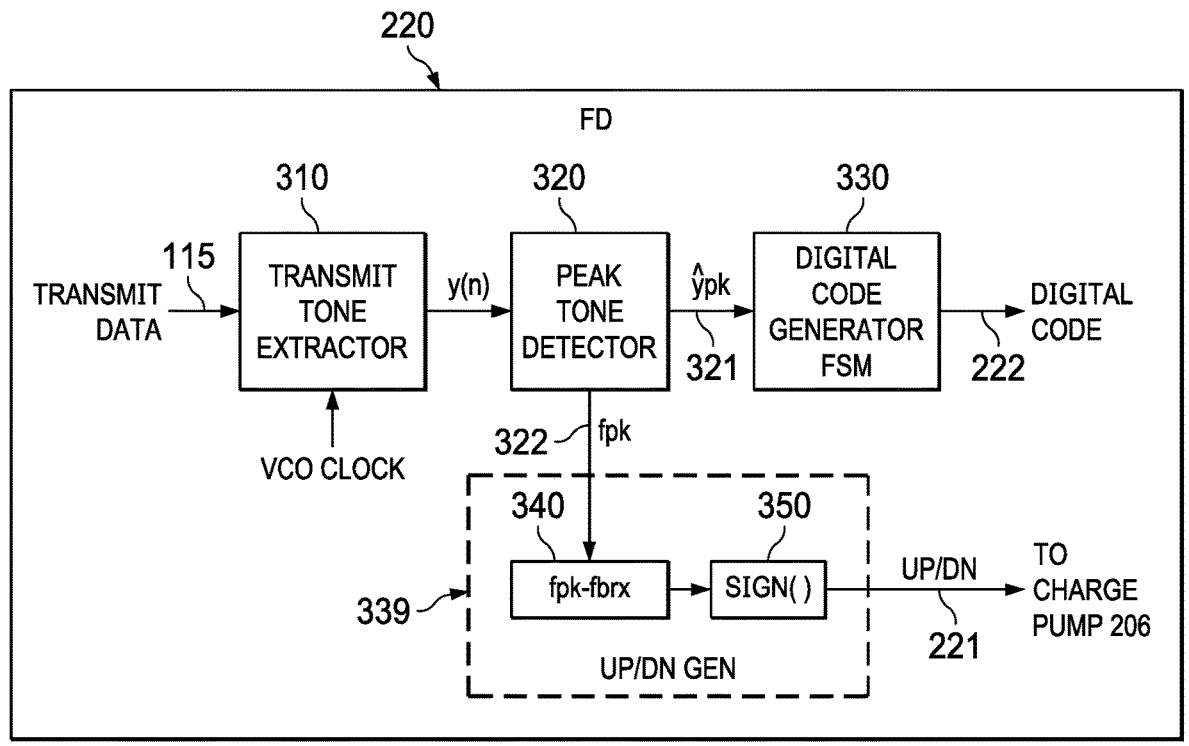
FIG. 4 shows an example implementation of a frequency detector of the CDR circuit of FIG. 2.

FIG. 4 shows an example implementation of the FD 220. The FD 220 includes a transmit tone extractor 310, a peak tone detector 320, a digital code generator finite state machine (FSM), and an UP/DN pulse generator 339. UP/DN pulse generator 339 includes a subtractor 340 and a SIGN circuit 350. The transmit tone extractor 310 has an input that receives the transmit data and produces an output signal y(n), as will be explained below. The output of the transmit tone extractor 310 is coupled to the input of the peak tone detector 320. The peak tone detector 320 converts y(n) to the frequency domain and determines the frequency (fpk) at which the largest spectral tone occurs. The magnitude of the largest spectral tone is ŷpk. ŷpk is provided to the digital code generator FSM 330. Digital code generator FSM 330 generates DIGITAL CODE 222 based on the value of ŷ_pk. Peak tone detector 320 provides fpk 322 to the subtractor 340 which determines the difference between the frequency of fpk and the recovered clock frequency (fbrx). The difference value is provided to SIGN 350 which generates the UP/DN signals 222 to charge pump 206. SIGN 350 generates an UP pulse to charge pump 206 if fpk−fbrx is greater than or equal to 0. Otherwise (if fpk−fbrx is less than 0), SIGN 350 generates a DN pulse.

Figure 5:
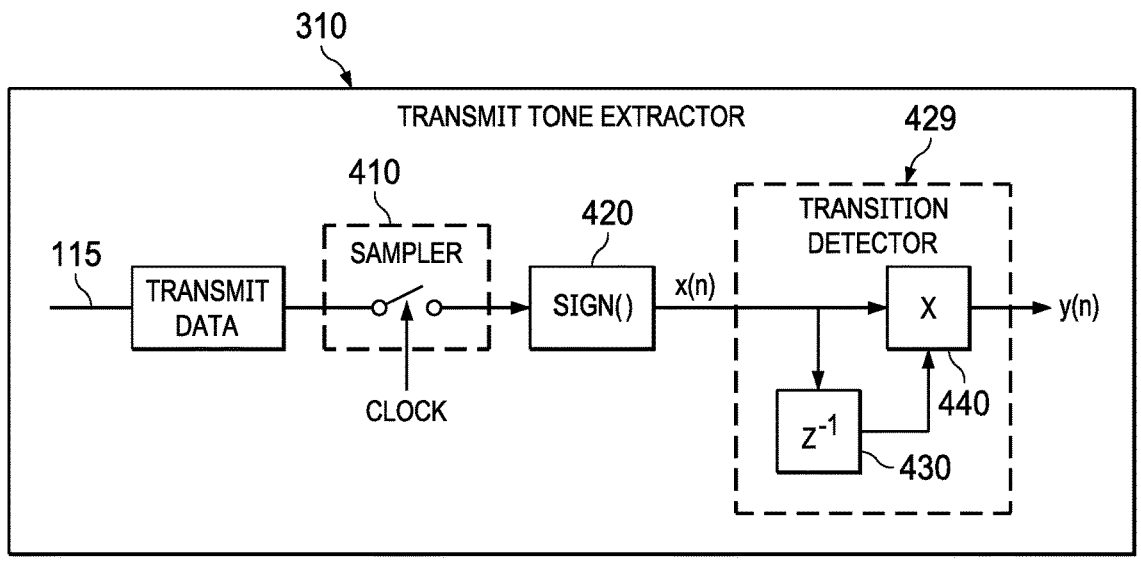
FIG. 5 shows an example implementation of a transmit tone extractor of the frequency detector of FIG. 4.

FIG. 5 shows an example implementation of the transmit tone extractor 310. The example transmit tone extractor 310 includes a sampler 410, SIGN 420, and transition detector 429. The transmit data from communication link 115 is provided to one terminal of sampler 410. The transmit data comprises an analog voltage that is sampled in accordance with a clock provided to the sampler 410. The clock that controls the sampler 410 may be derived from VCO CLOCK.

The output from the sampler 410 comprises a series of discrete-time sampled analog voltages which are then provided to SIGN 420. SIGN 420 quantizes the sampled voltages to produce x(n). SIGN 420 outputs a +1 (or equivalent) for each input sampled voltage that is equal to or greater than a threshold (e.g., 0); otherwise (for an input sampled voltage that is less than the threshold), SIGN 420 outputs −1 (or equivalent). As such, SIGN 420 converts the times series of input sampled voltages from sampler 410 to an output series x(n) of +1's and −1's.

As will be explained below regarding FIG. 6, the peak tone detector 320 converts its input signal into the frequency domain to identify the frequency having the peak spectral tone, which is the transmit data rate. The DFT or Fourier spectrum of the transmitted signal in modulation schemes such as NRZ or PAM4 (or other higher level schemes) can be shown to have a null (value 0) at integer multiples of the transmit data rate. The null will remain even after any continuous-time equalization as well as the SIGN 420 operation. Hence, the DFT of x(n) will also have a null at integer multiples of the transmit data rate.

As shown above, converting the sampled voltages from sampler 410 or x(n) from SIGN 420 directly to the frequency domain by, for example, a discrete Fourier transformer will result in a zero spectral value at the transmit data rate. As such, it would be of no use to compute a discrete Fourier transform (DFT) of the sampled voltages from sampler 410 or x(n). Instead, x(n) is provided to transition detector 429 which produces output signal y(n). Transition detector 429 includes a multiplier 440 and a delay element 430, and computes y(n) as x(n)×(x(n−1)), that is the product of x(n) with a one sample-delayed version of x(n). In one implementation, multiplier 440 is implemented as an exclusive-OR gate. In general, the transition detector 429 is any non-linear operation that ensures that there is a non-zero value of the Fourier transform of the output at the transmit data rate.

Computing the DFT of y(n) advantageously results in a non-zero spectral tone at the transmit data rate. For example, for a lossless channel, the Discrete-time-Fourier-transform of y(n) can be shown to be $$\hat{y}(f) = \left( \frac{e^{-j2\pi T_s f} - e^{-j2\pi T_b f}}{j2\pi f} \right),$$

where Ts is the sampling rate of the clock used in the sampler 410. Assuming that $$T_s < T_b/2, \hat{y}\left(\frac{k}{T_b}\right) \neq 0$$

and hence y(n) is a convenient choice for extracting the transmit data rate. In one implementation, the sampling rate Ts is chosen to be 1/(4*fbrx), where fbrx is the recovered clock frequency, thus representing an oversampling factor of 4.

Figure 6:
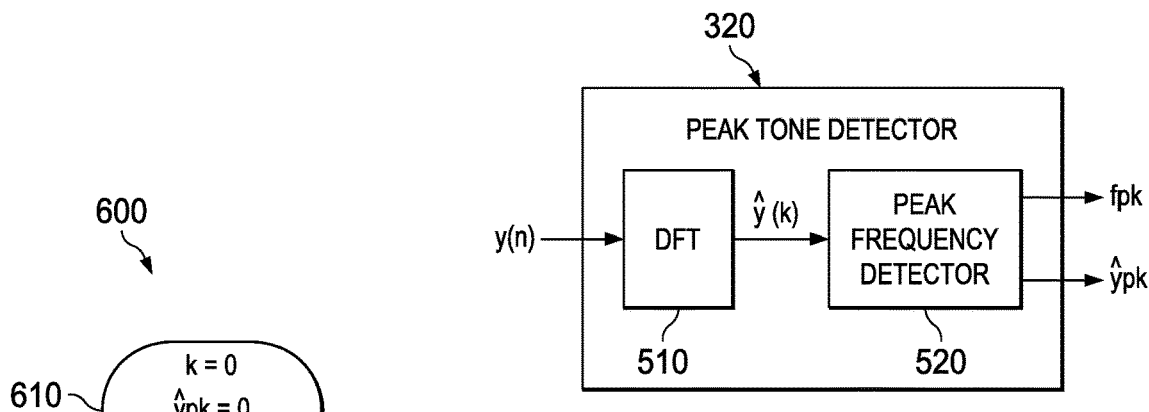
FIG. 6 shows an example implementation of a peak tone detector of the frequency detector of FIG. 4.

FIG. 6 shows an example implementation of the peak tone detector 320. In this example, the peak tone detector 320 includes a DFT 510 coupled to a peak frequency detector 520. The input to DFT 510 is y(n) from the transmit tone extractor 310. The DFT 510 computes the DFT of y(n) to convert y(n) to its frequency domain counterpart, ŷ(k). If the input sequence y(n) to DFT 510 has N points, the output of DFT 510 is given by $$\hat{y}(k) = \frac{1}{N}\sum_{n=0}^{N-1} y(n)e^{-\frac{j2\pi nk}{N}}.$$

The peak frequency detector 520 receives. ŷ(k) and determines ŷpk and fpk. The value ŷpk is the magnitude of the largest spectral tone which occurs at the transmit baud rate and fpk is the frequency of the peak tone (i.e., fpk represents the transmit baud date). Peak frequency detector 520 may be implemented as a discrete digital circuit comprising a combination of logic gates, flip-flops, comparators, etc. and may be synthesized based on the functionality described herein using any suitable circuit synthesization tool.

Figure 7:
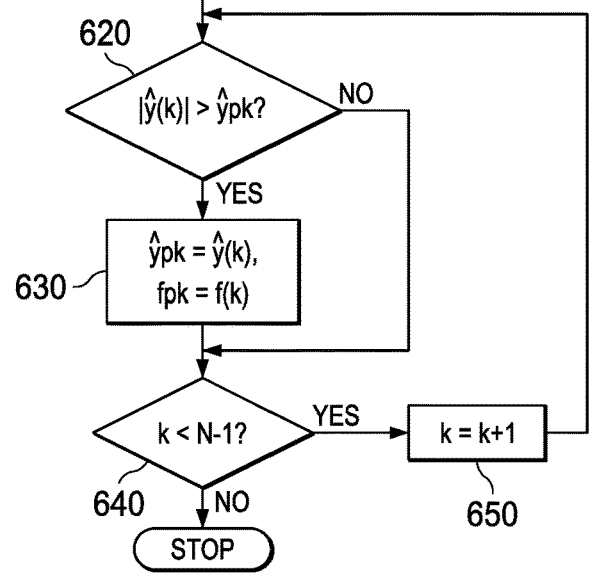
FIG. 7 illustrates the operation of the peak tone detector of FIG. 6.

FIG. 7 illustrates one possible method as to how the peak frequency detector 520 determines ŷpk and fpk. The method sweeps the frequency index k through the range of frequency components of the computed DFT (ŷ(k)) and determines which frequency component has the largest magnitude. At 610, the frequency index (k), ŷpk, and fpk are all initialized to 0. At 620, the method includes determining whether the absolute value of ŷ(k) is greater than ŷpk. If the absolute value of ŷ(k) is greater than ŷpk, then at 630, ŷpk is set to the current indexed frequency tone (ŷ(k)) and fpk is set to the current indexed frequency (fpk). At 640, the method determines whether k is at the end of the computed DFT. If k is not at the end of the computed DFT, then k is incremented at 650, and the process loops back to operation 620.

At 620, if it is determined that the absolute value of ŷ(k) is not greater than ŷpk, then operation 630 in which ŷpk and fpk are updated is skipped. Once index k has reached the end of the DFT spectrum, the process stops.

As is shown in FIG. 4, ŷpk is provided to the digital code generator FSM 330. The value of ŷpk represents the largest magnitude spectral component of the computed DFT, and thus represents the transmit baud rate. The digital code generator FSM 330 uses ŷpk to generate DIGITAL CODE 222 to be provided to the VCO 210.

Figure 8:
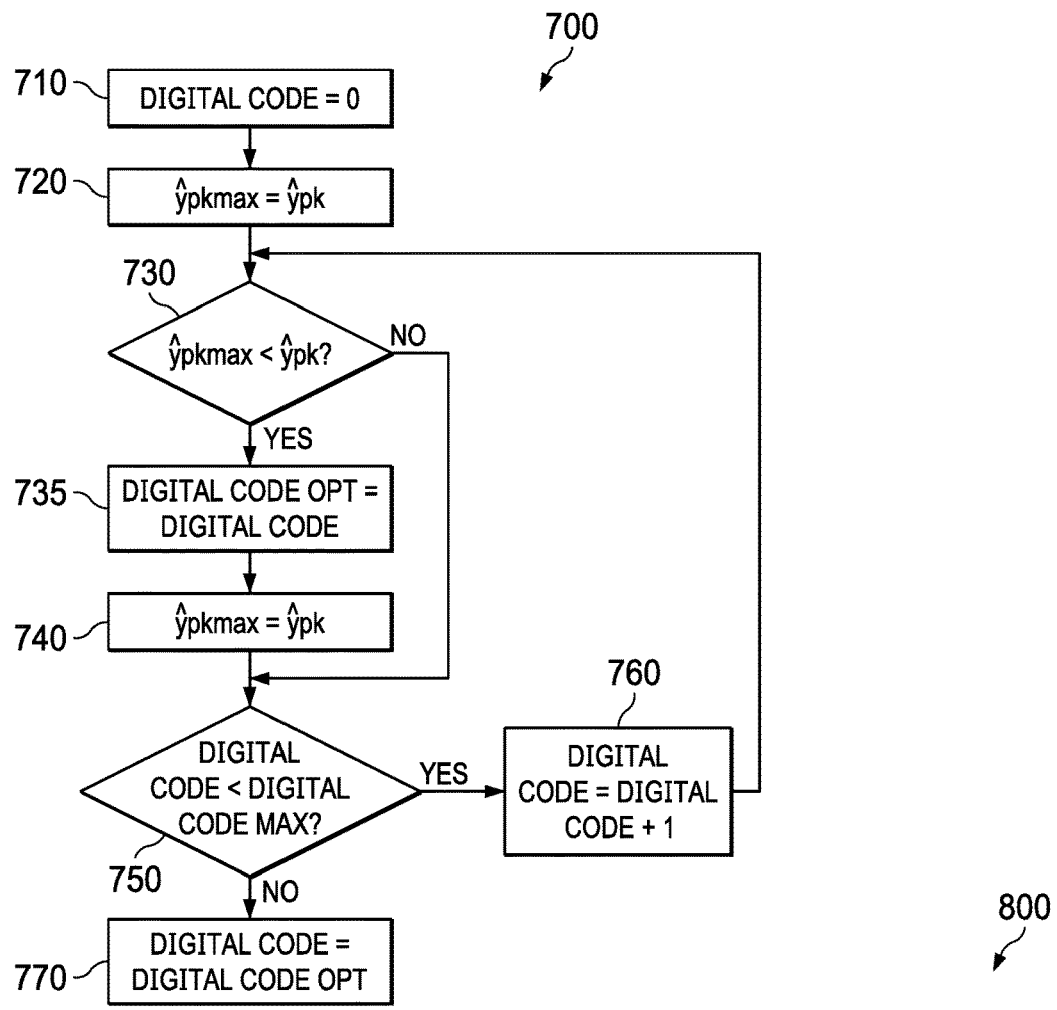
FIG. 8 illustrates the operation of a digital code generator finite state machine within the frequency detector of FIG. 4.

FIG. 8 provides an example method 700 for how the digital code generator FSM 330 uses pk to generate DIGITAL CODE 222. The digital code generator FSM 330 sweeps the DIGITAL CODE 222 through the full range of its possible values and determines for which DIGITAL CODE value the DFT spectrum has the largest frequency tone (i.e., for which DIGITAL CODE value ŷpk is the largest value.

At 710 and 720, the digital code generator FSM 330 initializes DIGITAL CODE to its lowest value (e.g., 0) and initializes the value ŷpkmax to the current ŷpk value. The current ŷpk value is the maximum frequency tone value with the DIGITAL CODE initialized to 0. The process will iteratively increase the DIGITAL CODE, sequencing the DIGITAL CODE upward until DIGITAL CODE reaches its maximum value (DIGITAL CODE MAX). In one example, DIGITAL CODE is an m-bit binary value and is sequenced from [00 . . . 0] to [11 . . . 1]. In some implementations, DIGITAL CODE is initialized to its maximum value and then decremented with each iteration through the process to its lowest value.

At 730, the digital code generator FSM 330 determines whether ŷpkmax is less than ŷpk (for the current value of DIGITAL CODE). The first time that operation 730 is performed ŷpkmax of course equals ŷpk, but such may not be the case for each successive iteration through the method. If ŷpkmax is less than ŷpk, then a temporary variable DIGITAL CODE OPT is set to the current value of DIGITAL CODE at 735, and ŷpkmax is reset to the current value of ŷpk at 740. At 750, the digital code generator FSM 330 determines whether the current value of DIGITAL CODE has reached its maximum value (DIGITAL CODE MAX). If DIGITAL CODE has not reached its maximum value, then at 760, the digital code generator FSM 330 increments DIGITAL CODE and control loops back to operation 730 at which the digital code generator FSM 330 determines whether the previously determined ŷpkmax is less than the new ŷpk for the new DIGITAL CODE setting. Once DIGITAL CODE reaches its maximum value (as determined at 750), the value of DIGITAL CODE to be used from that point forward by the CDR circuit 130 is set at 770 to DIGITAL CODE OPT, that is, the DIGITAL CODE that was determined to result in the largest spectral tone.

Figure 9:
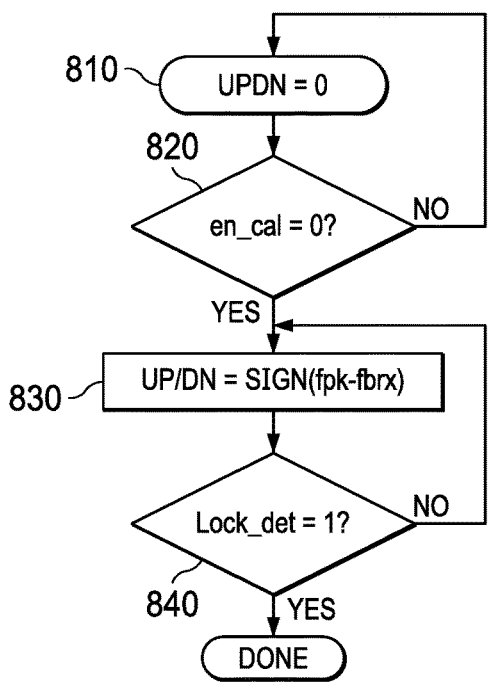
FIG. 9 illustrates the operation of frequency detector of FIG. 4 for generating up/down signals to the filter within the CDR circuit of FIG. 2.

Once the appropriate DIGITAL CODE is determined as illustrated in the example method 700 of FIG. 8, fine lock of the CDR circuit 130 occurs. The digital code generator FSM 330 asserts a flag en_cal to 0 when the digital code generator FSM 330 has completed the logic of FIG. 7. FIG. 9 illustrates an example operation of the UP/DN generator pulse 339. At 810, an updn variable is initialized to 0. As long as en_cal is not 0 (as determined at 820), control loops back to 810. Once en_cal is determined to be 0 (which occurs upon digital code generator FSM 330 determining the appropriate value of DIGITAL CODE), an UP/DN pulse is generated at 830 as the SIGN of the difference between fpk and fbrx (e.g., a positive pulse if the difference is a positive value, a negative pulse if the difference is a negative value, and no pulse if fpk equals fbrx). The charge pump 206 uses the UP/DN pulses to change VCTRL to the VCO 210.

The frequency resolution of the FD 220 is less than the lock range of the PD 202. As such, the PD 202 is able to lock on to the transmit baud rate. Once the CDR circuit 130 achieves frequency lock to the transmit baud rate (within a predetermined threshold), the flag lock_det is set to a value of 1 to indicate that the lock condition has been achieved. At 840, the method 800 determines whether lock_det is 1. If it is not 1, then another one or more UP/DN pulses are generated at 830. Once lock is achieved (lock_det equals 1), the process of generating UP/DN pulses to vary the magnitude of VCTRL ceases and VCTRL remains steady at its current level, with occasional changes due to the always-on PD 202 loop. In addition, there are other ways to determine that the phase-frequency-lock has occurred, which can be used to stop the generation of UP/PDN pulses.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. Modifications are possible in the described embodiments, and other embodiments are possible, within the scope of the claims.

What is claimed is:

1. A clock data recovery (CDR) circuit, comprising:
   a phase detector having a data input, a second input, and an output;
   a filter;
   a first charge pump coupled between the output of the phase detector and the filter;
   a voltage-controlled oscillator (VCO) having first and second inputs and an output, the first input of the VCO is coupled to the filter, and the VCO output is coupled to the second input of the phase detector;
   a frequency detector having a data input, a second input, and first and second outputs, the second output of the frequency detector is coupled to the second input of the VCO, the data input of the frequency detector is coupled to the data input of the phase detector, and the second input of the frequency detector is coupled to the output of the VCO; and
   a second charge pump coupled between the first output of the frequency detector and the filter.

2. The CDR circuit of claim 1, wherein the VCO is configured to generate a signal on its output at a frequency, wherein the frequency is adjustable based on a digital code from the frequency detector on its second output.

3. The CDR circuit of claim 1, wherein the frequency detector includes:
   a transmit tone extractor having the data input of the frequency detector and having an output, the transmit tone extractor configured to convert input data received on the data input to a second signal on the output of the transmit tone extractor, the second signal having a tone at a transmit data rate of the input data; and
   a peak tone detector having an input coupled to the output of the transmit tone extractor, wherein the peak tone detector includes a transformer configured to produce a frequency spectrum of the second signal from the transmit tone extractor.

4. The CDR circuit of claim 3, wherein the transformer is a discrete Fourier transformer.

5. The CDR circuit of claim 3, wherein the transmit tone extractor includes:
   a sampler coupled to the data input, the sampler configured to sample the input data on the data input;
   a sign circuit coupled to the sampler, the sign circuit configured to output a first sign value responsive to a sampled value from the sampler being greater than or equal to a threshold, and configured to output a second sign value responsive to the sampled value from the sampler being less than the threshold; and
   a transition detector coupled to the sign circuit, the transition detector configured to implement a non-linear operation to ensure that there is a non-zero value of the frequency spectrum at the transmit data rate.

6. The CDR circuit of claim 3, wherein the peak tone detector further includes a peak frequency detector configured to output a frequency value coincident with a peak of the frequency spectrum.

7. The CDR circuit of claim 6, wherein the frequency detector is configured to output up/down signals on the first output of the frequency detector responsive, at least in part, to a difference between the peak frequency value and a frequency of a signal from the output of the VCO.

8. The CDR circuit of claim 7, wherein the peak frequency detector is also configured to output a magnitude value indicative of the frequency spectrum magnitude coincident with the peak of the produced frequency spectrum.

9. The CDR circuit of claim 8, further including a digital code generator finite state machine (FSM) having an input coupled to the peak frequency detector, wherein the digital code generator FSM is configured to generate a digital code to provide to the VCO to control a frequency of a signal on the output of the VCO.

10. The clock data recovery (CDR) circuit of claim 9, wherein the digital code generator FSM is configured to:
    sweep through a set of digital codes; and
    for each digital code, determine whether a current peak of the DFT spectrum is smaller than the value of the peak of the produced frequency spectrum output by the peak frequency detector.

11. A circuit, comprising:
    a transmit tone extractor having an input and an output, the transmit tone extractor configured to convert input data received on its input to a second signal on the output of the transmit tone extractor, the second signal having a tone at a transmit data rate of the input data; and
    a peak tone detector having an input coupled to the output of the transmit tone extractor and having first and second outputs, wherein the peak tone detector includes a transformer configured to produce a frequency spectrum of the second signal from the transmit tone extractor;
    a digital code generator finite state machine (FSM) having an input coupled to the first output of the peak frequency detector, wherein the digital code generator FSM is configured to generate a digital code configured to control a frequency of a signal on the output of a VCO; and
    an up/down pulse generator coupled to the second output of the peak tone detector.

12. The circuit of claim 11, wherein the transformer is a discrete Fourier transformer.

13. The circuit of claim 11, wherein the transmit tone extractor includes:
    a sampler configured to sample the input data;
    a sign circuit coupled to the sampler, the sign circuit configured to output a first sign value responsive to a sampled value from the sampler being greater than or equal to a threshold, and configured to output a second sign value responsive to the sampled value from the sampler being less than the threshold; and
    a transition detector coupled to the sign circuit, the transition detector configured to implement a non-linear operation to ensure that there is a non-zero value of the frequency spectrum of the output at the transmit data rate.

14. The circuit of claim 11, wherein the peak tone detector further includes a peak frequency detector configured to output a frequency value on the second output coincident with a peak of the frequency spectrum.

15. The circuit of claim 14, wherein the peak frequency detector also is configured to output a magnitude value indicative of the frequency spectrum magnitude coincident with the peak of the produced frequency spectrum.

16. A clock data recovery (CDR) circuit, comprising:
a phase detector having a data input, a second input, and an output;
a first charge pump coupled to the output of the phase detector;
a voltage-controlled oscillator (VCO) having first and second inputs and an output, the VCO output is coupled to the second input of the phase detector;
a frequency detector having a data input, a second input, and first and second outputs, the second output of the frequency detector is coupled to the second input of the VCO, the data input of the frequency detector is coupled to the data input of the phase detector, and the second input of the frequency detector is coupled to the output of the VCO, the frequency detector is configured to produce values of a frequency spectrum; and
a second charge pump coupled to the first output of the frequency detector.

17. The CDR circuit of claim 16, wherein the frequency detector includes:
a transmit tone extractor having the data input of the frequency detector and having an output, the transmit tone extractor configured to convert input data received on the data input to a second signal on the output of the transmit tone extractor, the second signal having a tone at a transmit data rate of the input data; and
a peak tone detector having an input coupled to the output of the transmit tone extractor, wherein the peak tone detector includes a discrete Fourier transformer configured to produce a discrete Fourier transform (DFT) spectrum of the second signal from the transmit tone extractor.

18. The CDR circuit of claim 17, wherein the transmit tone extractor includes:
a sampler coupled to the first data input, the sampler configured to sample the input data on the data input; and
a sign circuit coupled to the sampler, the sign circuit configured to output a first sign value responsive to a sampled value from the sampler being greater than or equal to a threshold, and configured to output a second sign value responsive to the sampled value from the sampler being less than the threshold.

19. The CDR circuit of claim 17, wherein the peak tone detector further includes a peak frequency detector configured to output a frequency value coincident with a peak of the DFT spectrum.

20. The CDR circuit of claim 19, wherein the peak frequency detector is also configured to output a magnitude value indicative of the frequency spectrum magnitude coincident with the peak of the produced frequency spectrum.

* * * * *